(12) United States Patent
Lo et al.

(10) Patent No.: US 8,889,436 B2
(45) Date of Patent: Nov. 18, 2014

(54) METHOD FOR MANUFACTURING OPTOELECTRONIC DEVICES

(75) Inventors: Wu-Tsung Lo, Hsinchu (TW); Yu-Chih Yang, Hsinchu (TW); Rong-Ren Lee, Lee (TW)

(73) Assignee: Epistar Corporation, Hsinchu (TW)

( * ) Notice: Subject to any disclaimer, the term of this patent is extended or adjusted under 35 U.S.C. 154(b) by 322 days.

(21) Appl. No.: 13/455,207

(22) Filed: Apr. 25, 2012

(65) Prior Publication Data

US 2013/0286634 A1    Oct. 31, 2013

(51) Int. Cl.
*H01L 21/00* (2006.01)
(52) U.S. Cl.
USPC ....................................... 438/24; 257/E21.09
(58) Field of Classification Search
None
See application file for complete search history.

(56) References Cited

U.S. PATENT DOCUMENTS

2006/0227531 A1\* 10/2006 Iou ................................. 362/84
2011/0108856 A1\* 5/2011 Wu et al. ......................... 257/80

\* cited by examiner

*Primary Examiner* — William F Kraig
*Assistant Examiner* — Khaja Ahmad
(74) *Attorney, Agent, or Firm* — Muncy, Geissler, Olds & Lowe, P.C.

(57) ABSTRACT

A method for manufacturing optoelectronic devices comprising the steps of: providing a common growth substrate; forming a light-emitting epitaxy structure on the common growth substrate; forming a stripping layer on the light-emitting epitaxy structure; forming a solar cell epitaxy structure on the stripping layer; forming an adhesive layer on the solar cell epitaxy structure; proving a solar cell permanent substrate on the adhesive layer; and removing the stripping layer to form a light-emitting device and a solar cell device separately.

18 Claims, 8 Drawing Sheets

| Layer | Material | Growth temperature(°C) |
|---|---|---|
| 9 | Second conductivity type III-V group compound semiconductor layer | 700 |
| 8 | Active layer | 700 |
| 7 | First conductivity type III-V group compound semiconductor layer | 700 |
| 6 | Strip layer | 650 |
| 5 | GaInP cell | 600 |
| 4 | Tunnel junction | 600 |
| 3 | GaAs cell | 600 |
| 2 | Tunnel junction | 600 |
| 1 | Ge cell | 600 |

FIG. 5

METHOD FOR MANUFACTURING OPTOELECTRONIC DEVICES

TECHNICAL FIELD

The present application relates to a method for manufacturing optoelectronic devices, and more particularly to form a light-emitting device and a solar cell device by using a common growth substrate.

BACKGROUND

The light radiation theory of light-emitting device is to generate light from the energy released by the electrons moving between the n-type semiconductor layer and the p-type semiconductor layer. Because the light radiation theory of light-emitting device is different from the incandescent light which heats the filament, the light-emitting device is called a "cold" light source.

The light-emitting device mentioned above may be mounted with the substrate upside down onto a submount via a solder bump or a glue material to form a light-emitting apparatus. Besides, the submount further comprises one circuit layout electrically connected to the electrode of the light-emitting device via an electrical conductive structure such as a metal wire.

Moreover, the light-emitting device is more sustainable, longevous, light and handy, and less power consumption, therefore it is considered as a new light source for the illumination market. The light-emitting device applies to various applications like the traffic signal, backlight module, street light and medical instruments, and is gradually replacing the traditional lighting sources.

SUMMARY

The present application provides a method for manufacturing optoelectronic devices comprising the steps of: providing a common growth substrate, wherein the common growth substrate having a first surface and a second surface; forming a light-emitting epitaxy structure on the first surface of the common growth substrate; forming a stripping layer on the second surface of the common growth substrate; forming a solar cell epitaxy structure on the stripping layer opposite to the common growth substrate; forming an adhesive layer on the solar cell epitaxy structure opposite to the stripping layer; proving a solar cell permanent substrate on the adhesive layer opposite to the solar cell epitaxy structure; and removing the stripping layer to form a light-emitting device and a solar cell device separately.

The present application provides a method for manufacturing optoelectronic devices comprising the steps of: providing a common growth substrate; forming a light-emitting epitaxy structure on the common growth substrate; forming a stripping layer on the light-emitting epitaxy structure; forming a solar cell epitaxy structure on the stripping layer; forming an adhesive layer on the solar cell epitaxy structure; proving a solar cell permanent substrate on the adhesive layer; and removing the stripping layer to form a light-emitting device and a solar cell device separately.

The present application provides a method for manufacturing optoelectronic devices comprising the steps of: providing a common growth substrate; forming a solar cell epitaxy structure on the common growth substrate; forming a stripping layer on the solar cell epitaxy structure; forming a light-emitting epitaxy structure on the stripping layer; forming an adhesive layer on the light-emitting epitaxy structure; proving a light-emitting device permanent substrate on the adhesive layer; and removing the stripping layer to form a light-emitting device and a solar cell device separately.

The present application provides a method for manufacturing optoelectronic devices comprising the steps of: providing a common growth substrate, wherein the common growth substrate having a first surface and a second surface; forming a stripping layer on the first surface of the common growth substrate; forming a light-emitting epitaxy structure on the stripping layer; forming an adhesive layer on the light-emitting epitaxy structure; proving a light-emitting device permanent substrate on the adhesive layer; forming a solar cell epitaxy structure on the second surface of the common growth substrate; and removing the stripping layer to form a light-emitting device and a solar cell device separately.

BRIEF DESCRIPTION OF THE DRAWINGS

The foregoing aspects and many of the attendant advantages of this application are more readily appreciated as the same become better understood by reference to the following detailed description, when taken in conjunction with the accompanying drawings, wherein:

FIG. 5 is a diagram showing the temperature for growing a light-emitting device 100 and a solar cell device 200 in accordance with a fifth embodiment of the present application;

DETAILED DESCRIPTION OF THE PREFERRED EMBODIMENTS

The present application discloses a method for manufacturing optoelectronic devices. In order to make the illustration of the present application more explicit, the following description is stated with reference to FIG. 1 through FIG. 8.

Figure 1A:
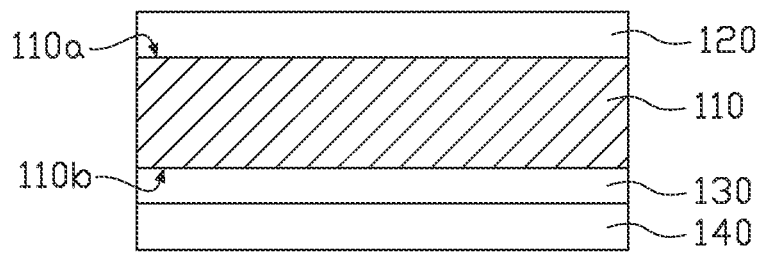
FIG. 1A through FIG. 1H are schematic diagrams showing the process flow for manufacturing a light-emitting device 100 and a solar cell device 200 in accordance with a first embodiment of the present application.
Figure 1B:
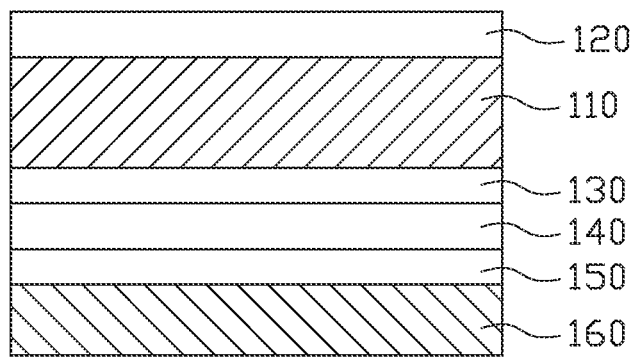
Figure 1C:
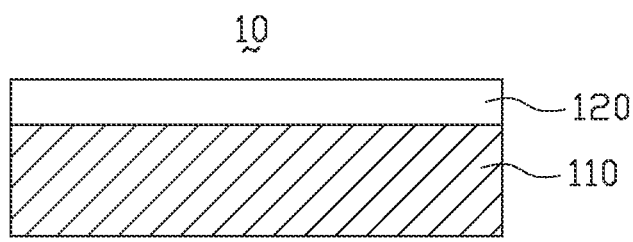
Figure 1D:
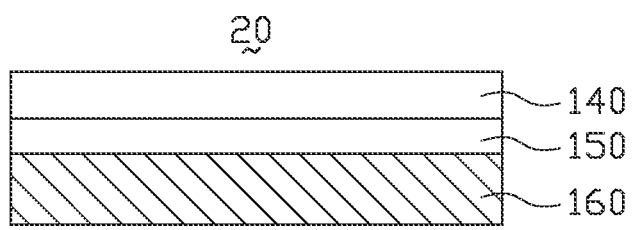

FIG. 1A through FIG. 1D are schematic diagrams showing the process flow for manufacturing a light-emitting structure 10 and a solar cell structure 20 in accordance with a first embodiment of the present application. As FIG. 1A shows, a common growth substrate 110 is provided for the epitaxial growth of epitaxial materials formed thereon, wherein the common growth substrate 110 having a first surface 110a and a second surface 110b. The material of the common growth substrate 110 may be GaAs or Ge. A light-emitting epitaxy structure 120 is grown on the first surface 110a of the common growth substrate 110 by, for example, metal organic chemical vapor deposition (MOCVD) method, liquid phase deposition (LPD) method, or molecular beam epitaxy (MBE) method. In the embodiment, the light-emitting epitaxy structure 120 comprises a first conductivity type III-V group compound semiconductor layer, an active layer, and a second conductivity type III-V group compound semiconductor layer (not shown) stacked on the first surface 110a of the common growth substrate 110. For example, the first conductivity type III-V group compound semiconductor layer is n-type AlGaInP series material, the active layer is AlGaInP series material, and the second conductivity type III-V group compound semiconductor layer is p-type AlGaInP series material. A stripping layer 130 is grown on the second surface 110b of the common growth substrate 110 by, for example, metal organic chemical vapor deposition (MOCVD) method, liquid phase deposition (LPD) method, or molecular beam epitaxy (MBE) method. The material of the stripping layer 130 may be AlAs or AlGaAs. A solar cell epitaxy structure 140 is grown on the stripping layer 130 opposite to the common growth substrate 110 by, for example, metal organic chemical vapor deposition (MOCVD) method, liquid phase deposition (LPD) method, or molecular beam epitaxy (MBE) method. In the embodiment, the solar cell epitaxy structure 140 may be a multiple junction solar cell epitaxy structure, which is a serial connection of three cells of GaInP/GaAs/Ge. A tunnel junction structure is disposed between two neighboring cells wherein every cell is formed of III-V group compound semiconductor (not shown). As FIG. 1B shows, an adhesive layer 150 is formed on the solar cell epitaxy structure 140 opposite to the stripping layer 130, wherein the material of the adhesive layer 150 may be Al, Au, Pt, Zn, Ag, Ni, Ge, In, Sn, Ti, Pb, Cu, Pd, or alloys of the aforementioned metals. In another embodiment, the material of the adhesive layer 150 may be silver glue, spontaneous conductive polymer, polymer materials mixed with conductive materials, or anisotropic conductive film (ACF). A solar cell permanent substrate 160 is provided on the adhesive layer 150 opposite to the solar cell epitaxy structure 140, wherein the material of the solar cell permanent substrate 160 may be germanium (Ge), copper (Cu), aluminum (Al), molybdenum (Mo), tungsten copper (CuW), silicon aluminum (SiAl), gallium arsenide (GaAs), indium phosphide (InP), silicon carbide (SiC), silicon (Si), gallium nitride (GaN), aluminum nitride (AlN) or diamond-like carbon (DLC). A wet etching solution containing hydrofluoric acid or citric acid is used for removing the stripping layer 130, then a light-emitting structure 10 as shown in FIG. 1C and a solar cell structure 20 as shown in FIG. 1D are formed separately.

Figure 1E:
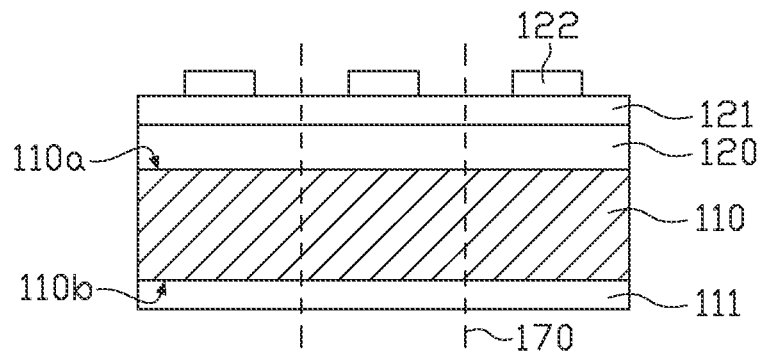
Figure 1F:
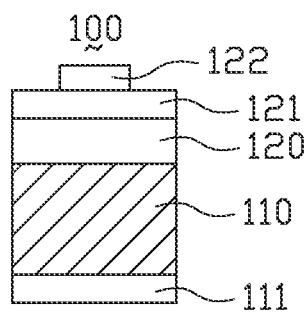
Figure 1G:
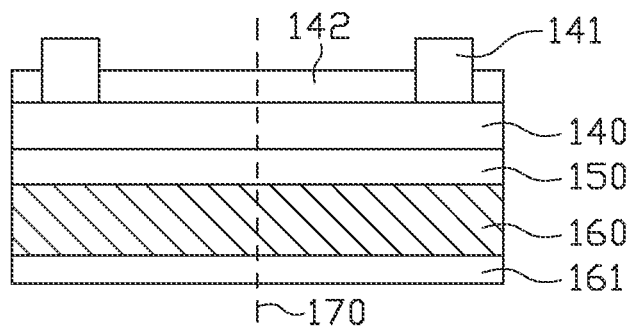
Figure 1H:
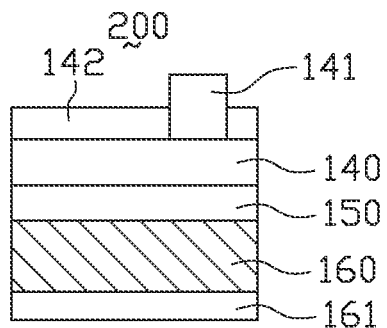

FIG. 1E through FIG. 1H are schematic diagrams showing the process flow for manufacturing a light-emitting device 100 and a solar cell device 200 in accordance with the above mentioned embodiments of the present application. As FIG. 1E shows, a transparent conductive layer 121 is formed on the light-emitting epitaxy structure 120, and a first electrode 122 is formed on the transparent conductive layer 121. A second electrode 111 is formed on the second surface 110b of the common growth substrate 110. Finally, dicing the transparent conductive layer 121, the light-emitting epitaxy structure 120, the common growth substrate 110, and the second electrode 111 along a cutting line 170 to form a light-emitting device 100 as shown in FIG. 1F. As FIG. 1G shows, an anti-reflective layer 142 is formed on a portion of the solar cell epitaxy structure 140, and a first electrode 141 is formed on the remained portion of the solar cell epitaxy structure 140. A second electrode 161 is formed on the solar cell permanent substrate 160 opposite to the adhesive layer 150. Finally, dicing the anti-reflective layer 142, the solar cell epitaxy structure 140, the adhesive layer 150, the solar cell permanent substrate 160, and the second electrode 161 along a cutting line 170 to form a solar cell device 200 as shown in FIG. 1H.

Figure 2A:
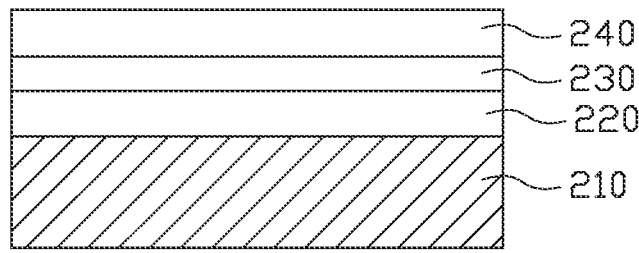
FIG. 2A through FIG. 2D are schematic diagrams showing the process flow for manufacturing a light-emitting device 100 and a solar cell device 200 in accordance with a second embodiment of the present application.
Figure 2B:
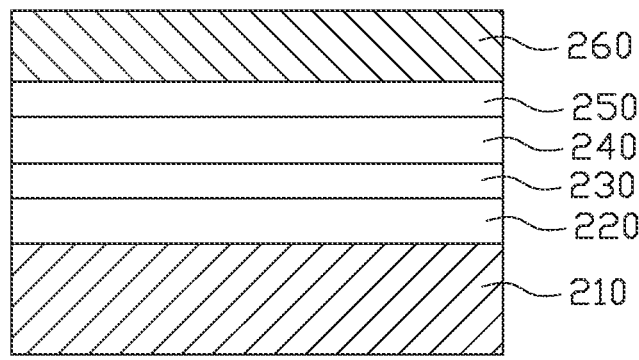
Figure 2C:
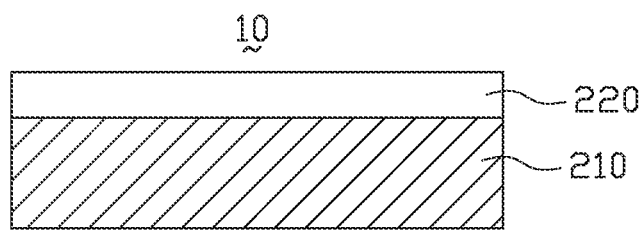
Figure 2D:
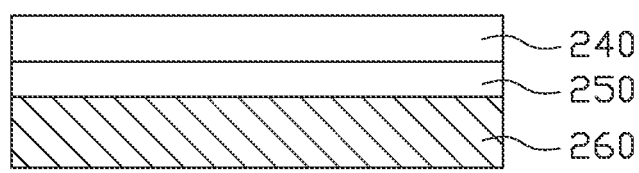

FIG. 2A through FIG. 2D are schematic diagrams showing the process flow for manufacturing a light-emitting structure 10 and a solar cell structure 20 in accordance with a second embodiment of the present application. As FIG. 2A shows, a common growth substrate 210 is provided for the epitaxial growth of epitaxial materials formed thereon. The material of the common growth substrate 210 may be GaAs or Ge. A light-emitting epitaxy structure 220 is grown on the common growth substrate 210 by, for example, metal organic chemical vapor deposition (MOCVD) method, liquid phase deposition (LPD) method, or molecular beam epitaxy (MBE) method. In the embodiment, the light-emitting epitaxy structure 220 comprises a first conductivity type III-V group compound semiconductor layer, an active layer, and a second conductivity type III-V group compound semiconductor layer (not shown) stacked on the common growth substrate 210. For example, the first conductivity type III-V group compound semiconductor layer is n-type AlGaInP series material, the active layer is AlGaInP series material, and the second conductivity type III-V group compound semiconductor layer is p-type AlGaInP series material. A stripping layer 230 is grown on the light-emitting epitaxy structure 220 by, for example, metal organic chemical vapor deposition (MOCVD) method, liquid phase deposition (LPD) method, or molecular beam epitaxy (MBE) method. The material of the stripping layer 230 may be AlAs or AlGaAs. A solar cell epitaxy structure 240 is grown on the stripping layer 230 by, for example, metal organic chemical vapor deposition (MOCVD) method, liquid phase deposition (LPD) method, or molecular beam epitaxy (MBE) method. In the embodiment, the solar cell epitaxy structure 240 may be a multiple junction solar cell epitaxy structure, which is a serial connection of three cells of GaInP/GaAs/Ge. A tunnel junction structure is disposed between two neighboring cells wherein every cell is formed of III-V group compound semiconductor (not shown). As FIG. 2B shows, an adhesive layer 250 is formed on the solar cell epitaxy structure 240, wherein the material of the adhesive layer 250 may be Al, Au, Pt, Zn, Ag, Ni, Ge, In, Sn, Ti, Pb, Cu, Pd, or alloys of the aforementioned metals. In another embodiment, the material of the adhesive layer 250 may be silver glue, spontaneous conductive polymer, polymer materials mixed with conductive materials, or anisotropic conductive film (ACF). A solar cell permanent substrate 260 is provided on the adhesive layer 250, wherein the material of the solar cell permanent substrate 260 may be germanium (Ge), copper (Cu), aluminum (Al), molybdenum (Mo), tungsten copper (CuW), silicon aluminum (SiAl), gallium arsenide (GaAs), indium phosphide (InP), silicon carbide (SiC), silicon (Si), gallium nitride (GaN), aluminum nitride (AlN) or diamond-like carbon (DLC). A wet etching solution containing hydrofluoric acid or citric acid is used for removing the stripping layer 230, then a light-emitting structure 10 as shown in FIG. 2C and a solar cell structure 20 as shown in FIG. 2D are formed separately. The light-emitting structure 10 and the solar cell structure 20 are manufactured by the same process in FIG. 1E through FIG. 1H to form a light-emitting device 100 and a solar cell device 200 respectively (not shown).

Figure 3A:
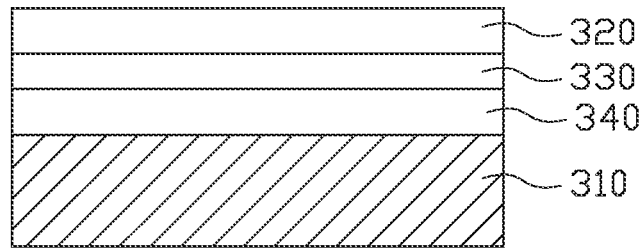
FIG. 3A through FIG. 3H are schematic diagrams showing the process flow for manufacturing a light-emitting device 100 and a solar cell device 200 in accordance with a third embodiment of the present application.
Figure 3B:
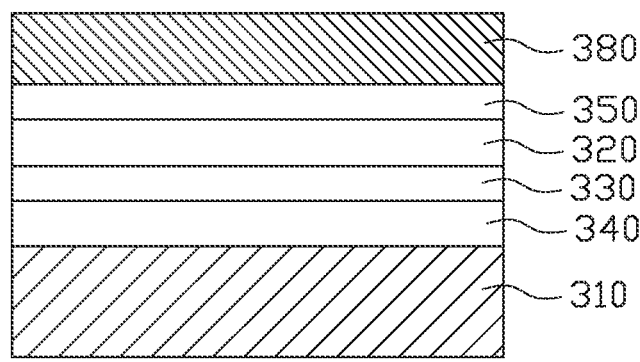
Figure 3C:
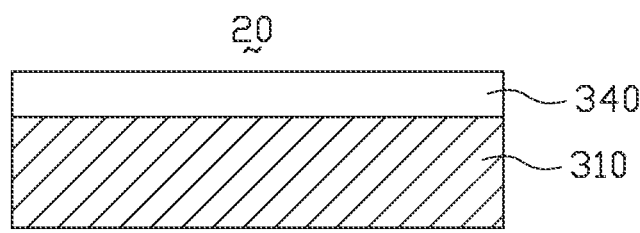
Figure 3D:
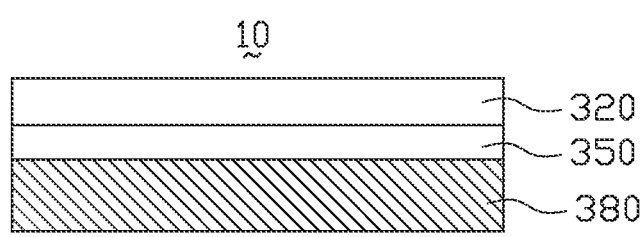

FIG. 3A through FIG. 3D are schematic diagrams showing the process flow for manufacturing a light-emitting structure 10 and a solar cell structure 20 in accordance with a third embodiment of the present application. As FIG. 3A shows, a common growth substrate 310 is provided for the epitaxial growth of epitaxial materials formed thereon. The material of the common growth substrate 310 may be GaAs or Ge. A solar cell epitaxy structure 340 is grown on the common growth substrate 310 by, for example, metal organic chemical vapor deposition (MOCVD) method, liquid phase deposition (LPD) method, or molecular beam epitaxy (MBE) method. In the embodiment, the solar cell epitaxy structure 340 may be a multiple junction solar cell epitaxy structure, which is a serial connection of three cells of GaInP/GaAs/Ge. A tunnel junction structure is disposed between two neighboring cells wherein every cell is formed of III-V group compound semiconductor (not shown). A stripping layer 330 is grown on the solar cell epitaxy structure 340 by, for example, metal organic chemical vapor deposition (MOCVD) method, liquid phase deposition (LPD) method, or molecular beam epitaxy (MBE) method. The material of the stripping layer 330 may be AlAs or AlGaAs. A light-emitting epitaxy structure 320 is formed on the stripping layer 330 by, for example, metal organic chemical vapor deposition (MOCVD) method, liquid phase deposition (LPD) method, or molecular beam epitaxy (MBE) method. In the embodiment, the light-emitting epitaxy structure 320 comprises a first conductivity type III-V group compound semiconductor layer, an active layer, and a second conductivity type III-V group compound semiconductor layer stacked on the stripping layer 330 (not shown). For example, the first conductivity type III-V group compound semiconductor layer is n-type AlGaInP series material, the active layer is AlGaInP series material, and the second conductivity type III-V group compound semiconductor layer is p-type AlGaInP series material. As FIG. 3B shows, an adhesive layer 350 is formed on the light-emitting epitaxy structure 320, wherein the material of the adhesive layer 350 may be Al, Au, Pt, Zn, Ag, Ni, Ge, In, Sn, Ti, Pb, Cu, Pd, or alloys of the aforementioned metals. In another embodiment, the material of the adhesive layer 350 may be silver glue, spontaneous conductive polymer, polymer materials mixed with conductive materials, or anisotropic conductive film (ACF). A light-emitting device permanent substrate 380 is provided on the adhesive layer 350, wherein the material of the light-emitting device permanent substrate 380 may be germanium (Ge), copper (Cu), aluminum (Al), molybdenum (Mo), tungsten copper (CuW), silicon aluminum (SiAl), gallium arsenide (GaAs), indium phosphide (InP), silicon carbide (SiC), silicon (Si), gallium nitride (GaN), aluminum nitride (AlN) or diamond-like carbon (DLC). A wet etching solution containing hydrofluoric acid or citric acid is used for removing the stripping layer 330, then solar cell structure 20 as shown in FIG. 3C and a light-emitting structure 10 as shown in FIG. 3D are formed separately.

Figure 3E:
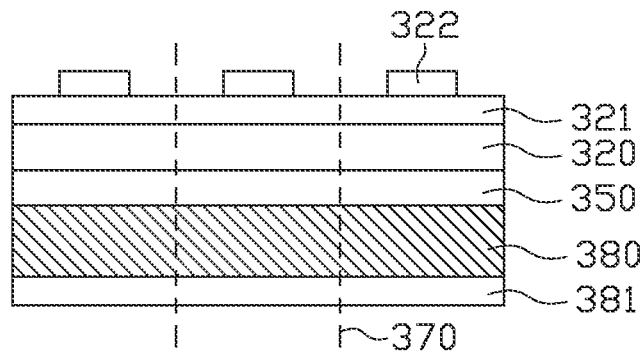
Figure 3F:
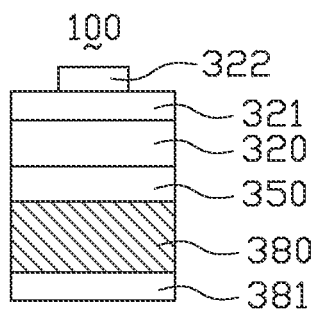
Figure 3G:
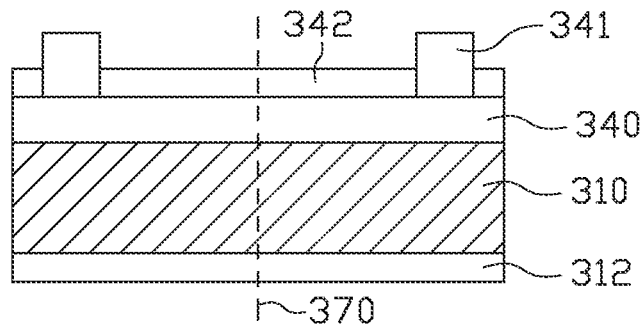
Figure 3H:
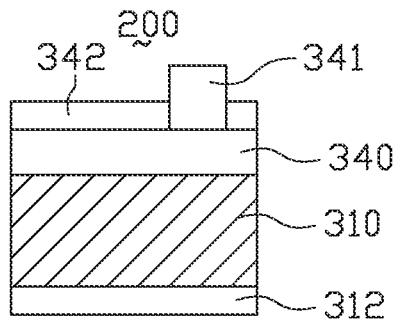

FIG. 3E through FIG. 3H are schematic diagrams showing the process flow for manufacturing a light-emitting device 100 and a solar device 200 in accordance with the above mentioned embodiments of the present application. As FIG. 3E shows, a transparent conductive layer 321 is formed on the light-emitting epitaxy structure 320, and a first electrode 322 is formed on the transparent conductive layer 321. A second electrode 381 is formed under the light-emitting device permanent substrate 380 opposite to the adhesive layer 350. Finally, dicing the transparent conductive layer 321, the light-emitting epitaxy structure 320, the adhesive layer 350, the light-emitting device permanent substrate 380, and the second electrode 381 along a cutting line 370 to form a light-emitting device 100 as shown in FIG. 3F. As FIG. 3G shows, an anti-reflective layer 342 is formed on a portion of the solar cell epitaxy structure 340, and a first electrode 341 is formed on the remained portion of the solar cell epitaxy structure 340. A second electrode 312 is formed under the common growth substrate 310 opposite to the solar cell epitaxy structure 340. Finally, dicing the anti-reflective layer 342, the solar cell epitaxy structure 340, the common growth substrate 310, and the second electrode 312 along a cutting line 370 to form a solar cell device 200 as shown in FIG. 3H.

Figure 4A:
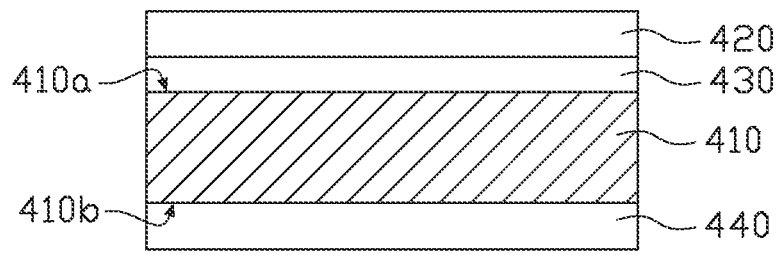
FIG. 4A through FIG. 4D are schematic diagrams showing the process flow for manufacturing a light-emitting device 100 and a solar cell device 200 in accordance with a fourth embodiment of the present application.
Figure 4B:
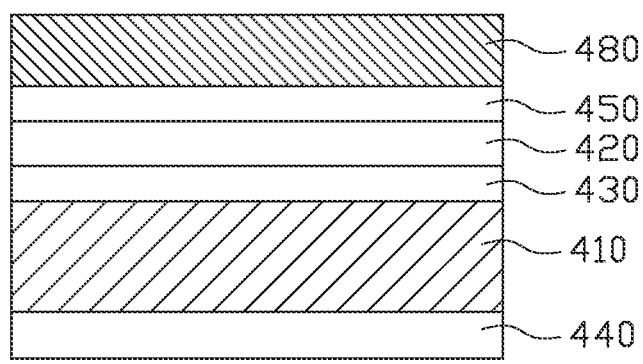
Figure 4C:
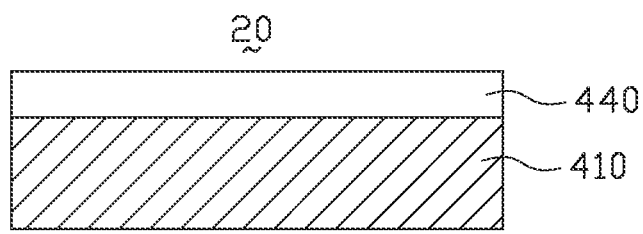
Figure 4D:
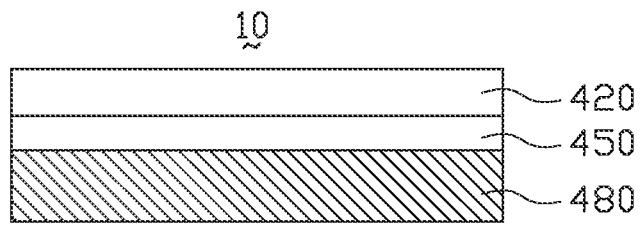

FIG. 4A through FIG. 4D are schematic diagrams showing the process flow for manufacturing a light-emitting structure 10 and a solar cell structure 20 in accordance with a fourth embodiment of the present application. As FIG. 4A shows, a common growth substrate 410 is provided for the epitaxial growth of epitaxial materials formed thereon, wherein the common growth substrate 410 having a first surface 410a and a second surface 410b. The material of the common growth substrate 410 may be GaAs or Ge. A stripping layer 430 is grown on the first surface 410a of the common growth substrate 410 by, for example, metal organic chemical vapor deposition (MOCVD) method, liquid phase deposition (LPD) method, or molecular beam epitaxy (MBE) method. The material of the stripping layer 430 may be AlAs or AlGaAs. A light-emitting epitaxy structure 420 is grown on the stripping layer 430 by, for example, metal organic chemical vapor deposition (MOCVD) method, liquid phase deposition (LPD) method, or molecular beam epitaxy (MBE) method. In the embodiment, the light-emitting epitaxy structure 420 comprises a first conductivity type III-V group compound semiconductor layer, an active layer, and a second conductivity type III-V group compound semiconductor layer (not shown) stacked on the stripping layer 430. For example, the first conductivity type III-V group compound semiconductor layer is n-type AlGaInP series material, the active layer is AlGaInP series material, and the second conductivity type III-V group compound semiconductor layer is p-type AlGaInP series material. A solar cell epitaxy structure 440 is grown on the second surface 410b the common growth substrate 410 by, for example, metal organic chemical vapor deposition (MOCVD) method, liquid phase deposition (LPD) method, or molecular beam epitaxy (MBE) method. In the embodiment, the solar cell epitaxy structure 440 may be a multiple junction solar cell epitaxy structure, which is a serial connection of three cells of GaInP/GaAs/Ge. A tunnel junction structure is disposed between two neighboring cells wherein every cell is formed of III-V group compound semiconductor (not shown). As FIG. 4B shows, an adhesive layer 450 is formed on the light-emitting epitaxy structure 420, wherein the material of the adhesive layer 450 may be Al, Au, Pt, Zn, Ag, Ni, Ge, In, Sn, Ti, Pb, Cu, Pd, or alloys of the aforementioned metals. In another embodiment, the material of the adhesive layer 450 may be silver glue, spontaneous conductive polymer, polymer materials mixed with conductive materials, or anisotropic conductive film (ACF). A light-emitting device permanent substrate 480 is provided on the adhesive layer 450, wherein the material of the light-emitting device permanent substrate 480 may be germanium (Ge), copper (Cu), aluminum (Al), molybdenum (Mo), tungsten copper (CuW), silicon aluminum (SiAl), gallium arsenide (GaAs), indium phosphide (InP), silicon carbide (SiC), silicon (Si), gallium nitride (GaN), aluminum nitride (AlN) or diamond-like carbon (DLC). A wet etching solution containing hydrofluoric acid or citric acid is used for removing the stripping layer 430, then a solar cell structure 20 as shown in FIG. 4C and a light-emitting structure 10 as shown in FIG. 4D are formed separately.

FIG. 5 shows the growth temperatures for growing a light-emitting epitaxy structure and a solar cell epitaxy structure in accordance with a fifth embodiment of the present application. A common growth substrate Ge is provided for the epitaxial growth of epitaxial materials formed thereon. A solar cell epitaxy structure is grown on the common growth substrate by, for example, metal organic chemical vapor deposition (MOCVD) method, liquid phase deposition (LPD) method, or molecular beam epitaxy (MBE) method. In the embodiment, the solar cell epitaxy structure may be a multiple junction solar cell epitaxy structure, which is a serial connection of three cells of GaInP/GaAs/Ge (layer 5/layer 3/layer 1). A tunnel junction structure is (layer 2, layer 4) disposed between two neighboring cells wherein every cell is formed of III-V group compound semiconductor. The growth temperature of the these layers is 600° C. A stripping layer (layer 6) is grown on the solar cell epitaxy structure by, for example, metal organic chemical vapor deposition (MOCVD) method, liquid phase deposition (LPD) method, or molecular beam epitaxy (MBE) method. The growth temperature of the stripping layer is 650° C. A light-emitting epitaxy structure is formed on the stripping layer by, for example, metal organic chemical vapor deposition (MOCVD) method, liquid phase deposition (LPD) method, or molecular beam epitaxy (MBE) method. In the embodiment, the light-emitting epitaxy structure comprises a first conductivity type III-V group compound semiconductor layer, an active layer, and a second conductivity type III-V group compound (layer 7-layer 9). The growth temperature of the these layers is 700° C.

Figure 6:
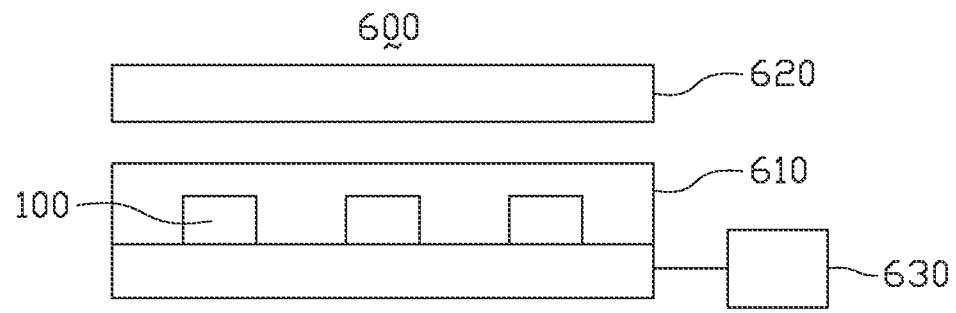
FIG. 6 is a schematic diagram of a backlight module device 600 in accordance with a sixth embodiment of the present application.

FIG. 6 shows a schematic diagram of a backlight module device 600 in accordance with a sixth embodiment of the present application. The backlight module device 600 comprises a light source device 610 having the light-emitting device 100 in one of the above mentioned embodiments, an optics device 620 deposited on the light extraction pathway of the light source device 610, and a power supplement 630 which provides a predetermined power to the light source device 610.

Figure 7:
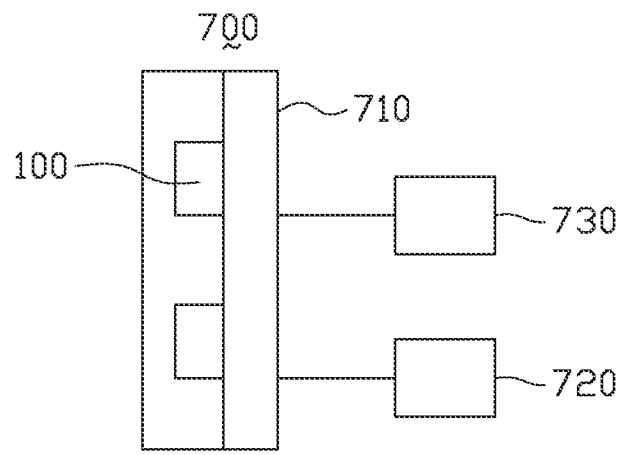
FIG. 7 is a schematic diagram of an illumination device 700 in accordance with a seventh embodiment of the present application.

FIG. 7 shows a schematic diagram of an illumination device 700 in accordance with a seventh embodiment of the present application. The illumination device 700 can be automobile lamps, street lights, flashlights, indicator lights and so forth. The illumination device 700 comprises a light source device 710 having the light-emitting device 100 in one of the above mentioned embodiments, a power supplement 720 which provides a predetermined power to the light source device 710, and a control element 730 which controls the current driven into the light source device 710.

Figure 8:
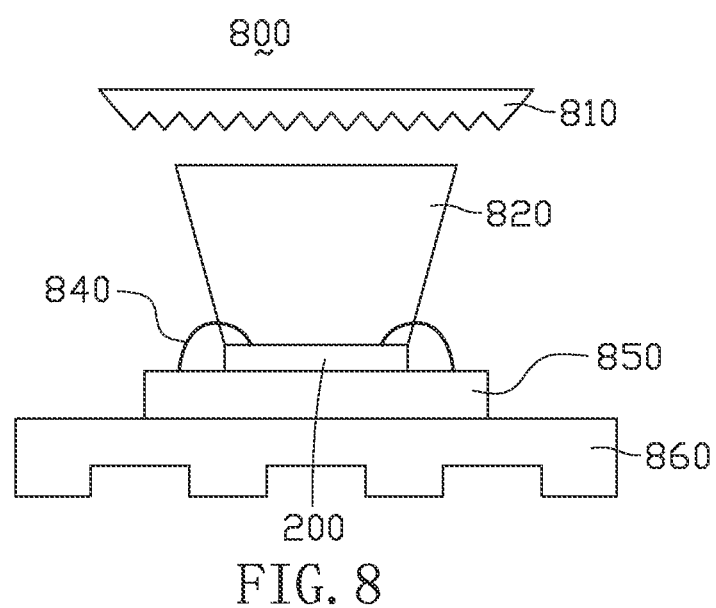
FIG. 8 is a schematic diagram of a solar cell module 800 in accordance with an eighth embodiment of the present application.

FIG. 8 shows a schematic diagram of a solar cell module 800 in accordance with an eighth embodiment of the present application. The solar cell module 800 comprises a heat sink 860 which provides the heat dissipation, a receiver 850 on the heat sink 860, a solar cell device 200 in one of the above mentioned embodiments on the receiver 850 wherein the solar cell device electrically connects with the receiver 850 by wire 840, a secondary optic lens 820 on the solar cell device 200, and a first optic lens 810 on the secondary optic lens 820 wherein the first optic lens 810 and the secondary optic lens 820 are used for focusing the sunlight.

In accordance with the embodiments in the application, the first conductivity type III-V group compound semiconductor layer and the second conductivity type III-V group compound semiconductor layer of the light-emitting epitaxy structure are two single-layer structures or two multiple layers structure ("multiple layers" means two or more than two layers) having different electrical properties, polarities, dopants for providing electrons or holes respectively. If the first conductivity type III-V group compound semiconductor layer and the second conductivity type III-V group compound semi-conductor layer are composed of the semiconductor materials, the conductivity type can be any two of p-type, n-type, and i-type. The active layer disposed between the first conductivity type III-V group compound semiconductor layer and the second conductivity type III-V group compound semiconductor layer is a region where the light energy and the electrical energy could transfer or could be induced to transfer.

In another embodiment of this application, the light emission spectrum of the light-emitting device 100 after transferring can be adjusted by changing the physical or chemical arrangement of one layer or more layers in the active layer. The material of the active layer can be AlGaInP or AlGaInN. The structure of the active layer can be a single heterostructure (SH), a double heterostructure (DH), a double-side double heterostructure (DDH), or a multi-quantum well (MQW) structure. Besides, the wavelength of the emitted light could also be adjusted by changing the number of the pairs of the quantum well in a MQW structure.

In one embodiment of this application, a buffer layer (not shown) could be optionally formed between the common growth substrate and the light-emitting epitaxy structure. The buffer layer between two material systems can be used as a buffer system. For the structure of the light-emitting device, the buffer layer is used to reduce the lattice mismatch between two material systems. On the other hand, the buffer layer could also be a single layer, multiple layers, or a structure to combine two materials or two separated structures where the material of the buffer layer can be organic, inorganic, metal, semiconductor, and so on, and the function of the buffer layer can be as a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on. The material of the buffer layer can be AlN, GaN, or other suitable materials. The fabricating method of the buffer layer can be sputter or atomic layer deposition (ALD).

A contact layer (not shown) can also be optionally formed on the light-emitting epitaxy structure. The contact layer is disposed on the second conductivity group type III-V compound semiconductor layer opposite to the active layer. Specifically speaking, the contact layer could be an optical layer, an electrical layer, or the combination of the two. An optical layer can change the electromagnetic radiation or the light from or entering the active layer. The term "change" here means to change at least one optical property of the electromagnetic radiation or the light. The above mentioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, or capacitance between any pair of the opposite sides of the contact layer. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 μm-0.6 μm.

What is claimed is:

1. A method for manufacturing optoelectronic devices comprising the steps of:
   providing a common growth substrate;
   forming a light-emitting epitaxy structure on the common growth substrate;
   forming a stripping layer on the light-emitting epitaxy structure;
   forming a solar cell epitaxy structure on the stripping layer;
   forming an adhesive layer on the solar cell epitaxy structure;
   providing a solar cell permanent substrate on the adhesive layer; and
   removing the stripping layer to form a light-emitting device and a solar cell device separately.

2. The method according to claim 1, wherein forming the light-emitting epitaxy structure, the stripping layer, and the solar cell epitaxy structure comprising the methods of: metal organic chemical vapor deposition, liquid phase deposition, or molecular beam epitaxy.

3. The method according to claim 1, wherein a material of the common growth substrate comprises GaAs or Ge.

4. The method according to claim 1, wherein a material of the stripping layer comprises AlAs or AlGaAs.

5. The method according to claim 1, wherein a material of the adhesive layer comprises metal, silver glue, conductive polymer, polymer materials mixed with conductive materials, or anisotropic conductive film.

6. The method according to claim 1, wherein a material of the solar cell permanent substrate comprises germanium, copper, aluminum, molybdenum, tungsten copper, silicon aluminum, gallium arsenide, indium phosphide, silicon carbide, silicon, gallium nitride, aluminum nitride or diamond-like carbon.

7. The method according to claim 1, wherein removing the stripping layer comprises wet etching solution containing hydrofluoric acid or citric acid.

8. The method according to claim 1, wherein forming the light-emitting device further comprising the steps of:
   forming a transparent conductive layer on the light-emitting epitaxy structure;
   forming a first electrode on the transparent conductive layer;
   forming a second electrode under the common growth substrate opposite to the light-emitting epitaxy structure; and
   dicing the transparent conductive layer, the light-emitting epitaxy structure, the common growth substrate and the second electrode along a cutting line.

9. The method according to claim 1, wherein forming the solar cell device further comprising the steps of:
   forming an anti-reflective layer on a portion of the solar cell epitaxy structure;
   forming a first electrode on the remained portion of the solar cell epitaxy structure;
   forming a second electrode under the solar cell permanent substrate opposite to the adhesive layer; and
   dicing the anti-reflective layer, the solar cell epitaxy structure, the adhesive layer, the solar cell permanent substrate and the second electrode along a cutting line.

10. A method for manufacturing optoelectronic devices comprising the steps of:
    providing a common growth substrate;
    forming a solar cell epitaxy structure on the common growth substrate;
    forming a stripping layer on the solar cell epitaxy structure;
    forming a light-emitting epitaxy structure on the stripping layer;
    forming an adhesive layer on the light-emitting epitaxy structure;
    providing a light-emitting device permanent substrate on the adhesive layer; and
    removing the stripping layer to form a light-emitting device and a solar cell device separately.

11. The method according to claim 10, wherein forming the light-emitting epitaxy structure, the stripping layer, and the solar cell epitaxy structure comprising the methods of: metal organic chemical vapor deposition, liquid phase deposition, or molecular beam epitaxy.

12. The method according to claim 10, wherein a material of the common growth substrate comprises GaAs or Ge.

13. The method according to claim 10, wherein a material of the stripping layer comprises AlAs or AlGaAs.

14. The method according to claim 10, wherein a material of the adhesive layer comprises metal, silver glue, conductive polymer, polymer materials mixed with conductive materials, or anisotropic conductive film.

15. The method according to claim 10, wherein a material of the solar cell permanent substrate comprises germanium, copper, aluminum, molybdenum, tungsten copper, silicon aluminum, gallium arsenide, indium phosphide, silicon carbide, silicon, gallium nitride, aluminum nitride or diamond-like carbon.

16. The method according to claim 10, wherein removing the stripping layer comprises wet etching solution containing hydrofluoric acid or citric acid.

17. The method according to claim 10, wherein forming the light-emitting device further comprising the steps of:
    forming a transparent conductive layer on the light-emitting epitaxy structure;
    forming a first electrode on the transparent conductive layer;
    forming a second electrode under the light-emitting device permanent substrate opposite to the adhesive layer; and
    dicing the transparent conductive layer, the light-emitting epitaxy structure, the adhesive layer, the light-emitting device permanent substrate and the second electrode along a cutting line.

18. The method according to claim 10, wherein forming the solar cell device further comprising the steps of:
    forming an anti-reflective layer on a portion of the solar cell epitaxy structure;

forming a first electrode on the remained portion of the solar cell epitaxy structure;

forming a second electrode under the common growth substrate opposite to the solar cell epitaxy structure; and dicing the anti-reflective layer, the solar cell epitaxy structure, the common growth substrate and the second electrode along a cutting line.

* * * * *